United States Patent [19]

Grazier et al.

[11] 4,122,396
[45] Oct. 24, 1978

[54] STABLE SOLAR POWER SOURCE FOR PORTABLE ELECTRICAL DEVICES

[76] Inventors: James A. Grazier; Leonard F. Grazier, both of P.O. Box 382, Berlin, Md. 21811

[21] Appl. No.: 658,861

[22] Filed: Feb. 18, 1976

Related U.S. Application Data

[63] Continuation-in-part of Ser. No. 493,910, Aug. 1, 1974, abandoned.

[51] Int. Cl.² ............................................. H01L 31/00
[52] U.S. Cl. ........................................ 325/492; 320/2; 136/89 AC; 136/89 P; 136/89 H
[58] Field of Search ...................... 136/1, 89; 250/212, 250/215, 239, 200, 211 R, 237, 238; 321/1.5; 320/2; 322/2 R, 100, DIG. 4, 2 A; 325/318–319, 492; 340/323

[56] References Cited

U.S. PATENT DOCUMENTS

| | | | |
|---|---|---|---|
| 2,892,931 | 6/1959 | Koch | 325/318 |
| 2,989,575 | 6/1961 | Wallace, Jr. | 250/238 |
| 3,205,482 | 9/1965 | Taylor, Jr. et al. | 325/333 |
| 3,384,806 | 5/1968 | Hartman | 332/2 R |
| 3,449,580 | 6/1969 | Heimann et al. | 250/238 |
| 3,523,739 | 4/1970 | Weisglass | 250/212 |
| 3,715,600 | 2/1973 | Fletcher | 250/212 |
| 3,844,840 | 10/1974 | Bender | 136/89 |
| 4,009,054 | 2/1977 | Gochermann et al. | 250/239 |
| 4,023,368 | 5/1977 | Kelly | 250/238 |

OTHER PUBLICATIONS

Radio Amateur's Handbook, 41st ed. 1964, p. 226.
Electrical Engineering, Sep. 1958.

*Primary Examiner*—Benedict V. Safourek
*Attorney, Agent, or Firm*—Sixbey, Friedman & Leedom

[57] ABSTRACT

The stable solar power source consists of solar cells for converting sunlight into electrical energy and a large capacitor for providing a current reserve to satisfy peak current demands and offset the effects of sunlight variations. The solar cells are mounted beneath a light transmitting thermal shield to minimize thermal induced cell output variations.

13 Claims, 3 Drawing Figures

STABLE SOLAR POWER SOURCE FOR PORTABLE ELECTRICAL DEVICES

This application is a continuation in part of our co-pending application Ser. No. 493,910 filed Aug. 1, 1974, and entitled Sun-Powered Batteryless Radio Receiver, now abandoned.

BACKGROUND OF THE INVENTION

Recent interest in the development of new energy sources has resulted in the recognition of solar power as an important replacement for the diminishing sources of conventional energy. Rapid development of solar technology has been fostered by space exploration programs, and solar energy cells of various types are now commercailly available. Unfortunately, the cost of commercial solar energy cells often makes them impractical for use in small, low cost appliances.

For a number of years there has been experimentation in the use of solar energy to power small, portable electrical appliances. Portable radios are an example of an appliance which is uniquely suited for use with a solar power source, for such radios are generally operated from a self contained power supply when used on beaches and in other outdoor environments. Similarly, small outdoor toys such as model boats, autos, trucks, helicopters, tractors and airplanes might well be powered by solar energy as well as other movable outdoor devices such as yard ornaments, fountains, etc.

Previous attempts to develop an economical solar power source capable of operating effectively with low cost portable appliances such as radios have not been commercially successful. Small, solid state radios are capable of operating from a 1½ volt power supply with a current requirement range of from 12 to 50 milliamps. A conventional battery has the capability to supply a stable 1½ volt requirement as well as a wide current range (0 to 300 + milliamps). However, a conventional solar cell power supply will provide no such stability because of the variable degree of light which the sun supplies. With even small, solid state portable radios, normal variations in sun angle and intensity will radically change the current and voltage operating constants provided by a solar cell power source, and thus will result in periods of insufficient voltage and/or current to maintain satisfactory radio reception. conversely, a brilliant sun may overpower the radio circuit thereby creating audio distortion. The wide range of voltage and current fluctuations from the solar power source cause variations in audio oscillation and audio distortion which, as a practical matter, render commercially useless a radio powered directly from a conventional solar power source.

Proposals have been made to power radios directly from solar power cells as illustrated by U.S. Pat. No. 3,205,482 to Taylor et al. Possibly this would be feasible but not reliable for emergency radio use where no other power source is available and erratic periods of distorted audio reception are better than no reception at all. Otherwise, such a direct solar powered radio receiver would be completely unsuitable for conventional use.

To offset to some extent the voltage and current fluctuations in a solar power source output resulting from solar light variations, it would be possible to overpower a use device, such as a radio, and thereby achieve some stability. A commerically available silicon solar cell with 10% efficiency provides a 0.4 volt output per cell, while the current output of each cell is a direct function of cell size. Thus a large power source having a large number of solar cells to provide a high voltage output and a large effective area to provide a high current output could be employed to power a small radio. If excess voltage and current were provided which equal in magnitude the projected current and voltage drops resulting from sun intensity variations plus the peak demands of the radio audio excursions, then direct solar cell power could possibly be employed to achieve acceptable radio operation. This solution is prohibitively expensive, for the cost of solar cells is high; i.e., $100 per watt for silicon cells.

To minimize the number of solar cells required to effectively power a radio, such cells have been used in combination with a battery. The cells operate through a charging circuit to charge the battery which then powers the radio. U.S. Pat. No. 2,919,353 is typical of the prior art relating to this type of battery charging system.

Ideally, a solar power source for small electrical devices should have the ability to furnish a substantially stable power output directly to an electrical device without requiring the use of an intermediate battery and battery charging circuit. To achieve economy, the minimum number of solar cells necessary to provide the normal operating voltage for the electrical device should be used, and the size of the cells should be limited to the minimum size necessary to provide a normal operative current range.

It is a primary object of the present invention to provide a novel and improved solar power source capable of providing substantially stable electrical energy directly to an electrical unit. Sun-power is translated to useable power through conversion of sunlight into electrical energy by means of silicon crystal solar cells or other known solar cells. No batteries of any kind are required, although a battery may be used as a completely separate, independent source of power.

Another object of the present invention is to provide a novel and improved solar power source for use as a direct, primary electrical power source for an electrical unit which places a varying current demand on the power source. The solar power source includes a plurality of solar cells designed to provide the normal voltage and current requirements of the electrical unit supplied therefrom and a large capacitor across the output of the solar cells provides a current reserve to satisfy the peak demands of the electrical unit and offset the effects of variations in sunlight.

A further object of the present invention is to provide a novel and improved solar power source for use with portable electrical units which includes a solar cell thermal shielding assembly to facilitate uniform solar cell operation during long periods of exposure to direct sunlight.

A still further object of the present invention is to provide a novel and improved solar powered radio receiver which includes a direct solar power source consisting of solar cells designed to provide the normal operating current and voltage requirements for the radio receiver. The solar cells are mounted on the top surface of the receiver beneath a thermal shield, and a large capacitor is connected across the cell output to provide a current reserve to satisfy peak current demands and to offset the effects of variations in sunlight.

These and other objects of the present invention will become readily apparent from a consideration of the following specification and claims taken in conjunction with the accompanying drawings in which:

Figure 1:
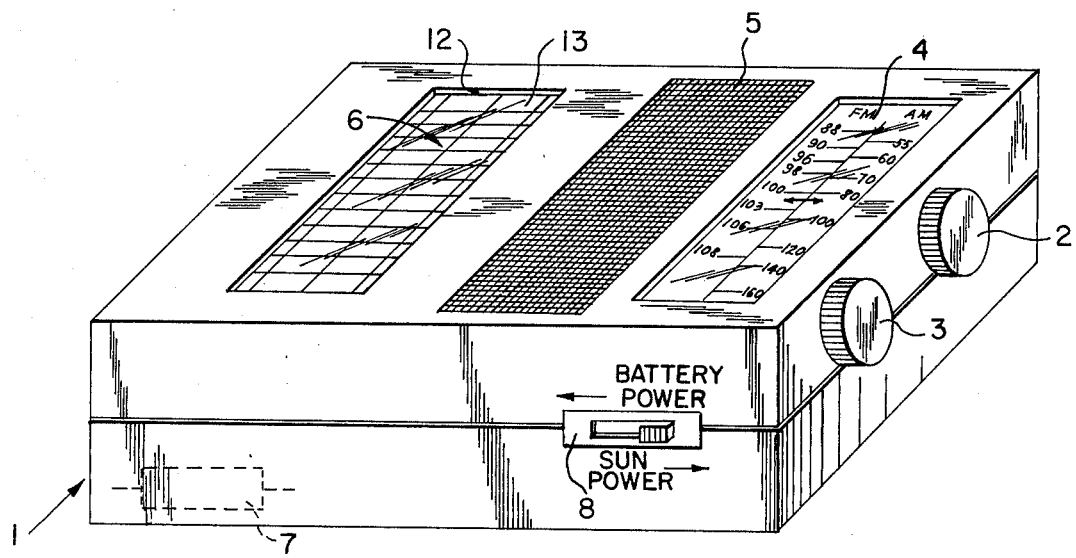
FIG. 1 is a perspective view of a radio receiver provided with the solar power source of the present invention.

The stable solar power source of the present invention is specifically adapted for use with solid state radio receivers and will be herein described as a direct current power source for such receivers. However, it should be recognized that this power source may also be employed to power toys and other small electrical devices. The power source is particularly effective with units which have varying peak current requirements within a determinable range.

Referring now to the drawings, a solid state radio receiver of conventional design is mounted within a housing 1, and includes a tuning control knob 2 and a volume control, on-off knob 3 which are connected to operate the radio receiver in a known manner. A radio dial 4 and speaker grill 5 are mounted in the top wall of the radio housing as is a solar cell assembly 6. The solar cell assembly in combination with a capacitor 7 operates in a manner to be subsequently described.

Electrical devices which are to be directly powered by the stable solar power source of this invention will normally require an electrical input within the range of from 1½ volts to 6 volts and current within the range of from 12 milliamps to 100 milliamps. However, such electrical devices will often demand varying current with peak currents above this current range, and this is particularly true with solid state radio receivers which are subject to the peak demands of audio fluctuations.

Unlike a conventional battery which can readily accommodate the peak current demands of a solid state radio receiver, a conventional solar cell, such as a silicon cell, has a set, substantially nonvarying power output. The electrical energy provided is the result of a common and well-known phenomenon wherein when light falls on a silicon photon unit, the energy is absorbed by an electron creating a negative-positive charge pair. The charge pair has a short life, about one millionth of a second, after which they recombine. When a separating force is provided in the form of a built-in electric field, the charges can be driven out of the silicon before they recombine. When the silicon cell is illuminated, a photo current flows and a voltage is developed, thus causing the cell to provide the current to power an electrical device.

Figure 2:
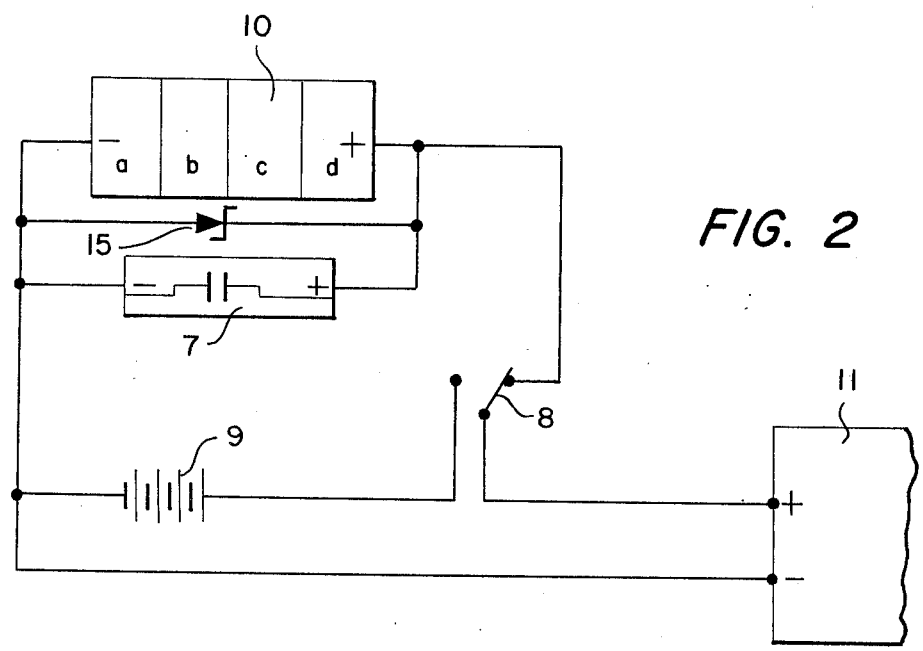
FIG. 2 is a block diagram of the circuit for the solar power source of the present invention.
Figure 3:
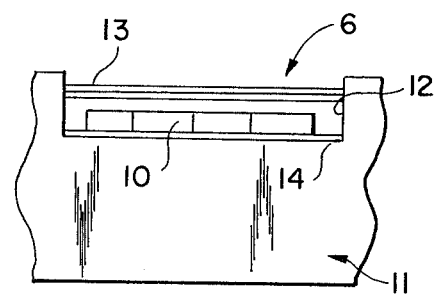
FIG. 3 is a sectional view showing the thermally shielded solar cell assembly for the solar power source of the present invention.

Turning now to FIG. 2, a group of solar cells 10 are connected together to provide a combined power output. These are conventional silicon solar cells such as the conventional Chevron cells sold by the Solarex Company of Rockville, Maryland. Such cells are generally connected in parallel with each cell providing a 0.4 volt output. The power supply of the present invention employs at least four of such interconnected cells (a, b, c and d) which ideally have an upper surface area for exposure to sunlight of at least 3 square centimeters. These cells provide a 1½ volt output and about 40 milliamps of current. The upper surface area of these four cells should always be of sufficient area to permit the interconnected cells to provide current outputs within the range of from 25 to 100 milliamps at 1½ volts.

The upper voltage range power supply of the present invention is a 6 volt supply employing sixteen interconnected solar cells, each having a 0.4 volt output. Ideally, these cells have an upper surface area of at least 1½ square centimeters and are interconnected to provide a total current output of about 40 milliamps. With a 6 volt output, the upper surface area of these cells should be of sufficient size to prodice a total current output within the range of from 12 to 100 milliamps. For example, 1 square centimeter of silicon will generate 100 mw of power at 1° C, and using this formula, the required cell surface can be calculated.

With 16 interconnected solar cells, the cells will be divided into groups with, for example, four cells in each group. The groups of cells will be connected in parallel while the cells in each group will be connected in series.

In a hypothetical situation where direct sunlight of a constant, nonvarying intensity is available, the solar cells 10 would provide a substantially constant current and voltage to directly power an electrical device. However, even in this hypothetical situation, the electrical device would not operate effectively if the current and voltage output of the power supply is closely matched to the normal requirements of the electrical device unless the current and voltage demands of the electrical device are substantially constant. Thus, even with ideal sunlight conditions, a solid state radio receiver would not operate effectively with a closely matched solar power supply due to variable peak current demands.

To provide a source of supplemental current to offset the effects of sunlight variations and to supplement the normal current output of the solar cells to satisfy peak current demands, an extremely large electrolytic capacitor 7 is connected across the output of the solar cells 10. This capacitor is much larger than capacitors such as the normal bypass capacitor used in conventional radio receiver circuits, and for the 1½ to 6 volt, 12 to 100 milliamp solar power supplies of the present invention, this capacitor should be within the range of from 500 to 3000 microfarads. Ideally, with both the 1½ volt and 6 volt power suplies, a 900 to 1000 microfarad capacitor will be employed. Capacitors above the 3000 microfarad value require an excessive charging time while capacitors smaller than 500 microfarads do not store sufficient supplemental current.

The output terminals of the solar cells 10 are connected directly to the inputs of an electrical use device 11, which may be the radio receiver of FIG. 1. This electrical use device is of a type which requires a normal voltage and current input which the solar cells 10 are designed to meet. The use device also demands peak current inputs which exceed the normal capacity of the solar cells 10, and these demands are satisfied by the capacitor 7 connected across the outputs of the solar cells and the inputs of the use device. The capacitor also acts as a ballast for the solar cells to prevent sudden changes in sun intensity from affecting the power input to the device 11. To aid the capacitor in controlling over voltage conditions, a Zener Diode 15 is connected in parallel with the capacitor 7 and the solar cells 10. This diode operates in a known manner as a voltage limiting device to prevent the peak voltage output from the solar cells during periods of intense sunlight from causing audio distortion in the radio receiver.

The combination of the solar cells 10 and the capacitor 7 provides a very effective stable solar power source which is fully capable of serving as the sole source of the power for the electrical use device 11. For some applications, it may be desirable to provide a separate battery power source to serve at night or during the absence of sunlight. This separate battery source 9 may be selectively connected across the inputs to the device 11 by a switch 8 which simultaneously breaks the connection to the solar cells 10 and the capacitor 7. It is important to note that the battery is a power supply which is entirely separate from the solar power supply, and at no time are the two connected. The solar cells do not charge the battery, for the switch 8 insures that the two power sources are never connected electrically.

If silicon solar cells are mounted on the top surface of a radio or other portable electrical device and are exposed for long periods to direct sunlight, the cells heat to high temperatures and begin to lose voltage. For example, with a 1½ volt solar power supply using four silicon solar cells, if the temperature of the cells exceeds 140° F, the power supply may easily lose ¼ volt from the total output voltage. This heat induced voltage loss must be prevented if many solar powered devices, such as solid state radio receivers, are to operate effectively. Radio receivers are particularly vulnerable, as they are in great demand for beach and other outdoor uses where direct sunlight causes extremely high temperatures.

To maintain the solar cells 10 at a temperatures of less than 140° F, the cells are preferably mounted within a recess 12 formed in the top wall of the use device 11. The cells are then covered by a flat sheet of thermal insulating glass which spans the recess above the cells. This insulating glass may be any suitable transparent insulating glass of known type, and generally consists of two thin sheets of glass with a transparent insulating layer between the sheets. It is important that the glass sheet 13 be very flat so that light may pass freely therethrough with the sun at all angles. Also the flat glass sheet should be very thin, and sheets within a range of 3 millimeters to 6 millimeters in thickness have been found to be particularly suitable.

To further dissipate heat from the solar cells 10, the cells may be mounted upon a heat reflecting or heat dissipating layer 14.

We claim:

1. A stable solar power source adapted to supply power directly to the input terminals of an electrical use device which is normally operated by a first input current level, but which periodically requires peak input current levels which exceed said first input current level, said stable solar power source including a plurality of interconnected solar cells which convert sunlight into direct current electrical energy and supply said direct current electrical energy to an output, said plurality of interconnected solar cells providing said output with said input current level subject to periodic fluctuations due to blockage of incident sunlight by clouds, said stable solar power source also including a voltage limiting device connected in parallel with said plurality of interconnected solar cells and said electrical use device, and a capacitive means connected in parallel with said plurality of interconnected solar cells and said electrical use device, said capacitive means having a large capacitance in excess of 500 microfarads sufficient to permit said capacitive means to supply the peak input current level required by said electrical use device and to operate as a ballast for the plurality of interconnected solar cells to offset said fluctuations in current supplied by said solar cells.

2. The stable solar power source of claim 1 wherein said plurality of connected solar cells are mounted at an upper surface of said electrical use device in a manner such that the cells have a flat upper surface.

3. The stable solar power source of claim 1 wherein said mounting means includes a light reflective surface adjacent the periphery of said plurality of interconnected solar cells.

4. The stable solar power source of claim 1 wherein said mounting means includes a heat dissipating means for dissipating heat from said solar cells.

5. The stable solar power source of claim 1 wherein said light transmitting thermal insulating means includes a flat sheet of thermal insulating glass having a thickness within the range from 3 to 6 millimeters, said glass being mounted in spaced parallel relationship to the upper surface of the said solar cells.

6. The stable solar power source of claim 1 wherein said plurality of interconnected solar cells is adapted to provide a normal output current range from 12 to 100 milliamperes with a normal output voltage within the range of from 1½ to 6 volts, and said capacitive means has a capacitance within the range of from 500 to 3000 microfarads.

7. The stable solar power source of claim 1 which includes a secondary battery power source connectable across the input terminals of the said electrical use device, said battery power source being connected between said capacitive means and said electrical use device, and switching means between said battery, capacitive means, and use device to selectively connect either said battery or said capacitive means and plurality of interconnected solar cells to the input terminals of said electrical use device.

8. The stable solar power source of claim 1 wherein said stable solar power source includes a light transmitting thermal insulating means extending over said plurality of interconnected solar cells to pass light to said solar cells while shielding said cells from thermal effects, and a mounting means for mounting said solar cells and thermal shielding means.

9. A stable solar power source adapted to supply power directly to the input terminals of a radio receiver which is normally operative by a first input current level, but which periodically requires peak input current levels which exceed said first input current levels, said stable solar power source including a plurality of interconnected solar cells which convert sunlight into direct current electrical energy and supply said direct current electrical energy to an output, the plurality of interconnected solar cells providing said output with said first input current level subject to periodic fluctuations due to blockage of incident sunlight by clouds, said stable solar power source also including a voltage limiting device connected in parallel with said plurality of interconnected solar cells and said radio receiver, and a capacitive means connected in parallel with said plurality of interconnected solar cells and said radio receiver, said capacitive means having a large capacity in excess of 500 microfarads sufficient to permit said capacitive means to supply the peak input current levels required by the radio receiver and to operate as a ballast for the plurality of interconnected solar cells to offset said fluctuations in current supplied by a said solar cells.

10. The stable solar power source of claim 9 wherein said plurality of interconnected solar cells are mounted on an upper surface of said radio receiver in a manner such that the cells have a flat upper surface, said stable solar power source also including a light transmitting thermal insulating means extending over said solar cells in parallel spaced relationship to the flat upper surface of the cells, said light transmitting thermal insulating means including a flat sheet of thermal insulating glass having a thickness within the range of from 3 to 6 millimeters and operating to pass light to the solar cells while shielding the cells from thermal effects, and mounting means for mounting said plurality of interconnected solar cells and thermal shielding means at the upper surface of said radio receiver.

11. The stable solar power source of claim 10 wherein said plurality of interconnected solar cells is adapted to provide a normal output current within the range of from 12 to 100 milliamperes with a normal output voltage within the range of from 1½ to 6 volts and said capacitive means has a capacitance within the range of from 500 to 3000 microfarads.

12. The stable solar power source of claim 11 wherein the said mounting means includes a light reflective surface adjacent the periphery of said plurality of interconnected solar cells.

13. The stable solar power source of claim 12 which includes a battery having first and second terminals, the input terminal of said radio receiver including first and second terminals, and the output of said plurality of interconnected solar cells including first and second terminals, the capacitive means being connected across the first and second terminals of said plurality of interconnected solar cells, said first terminals of said plurality of interconnected solar cells and said battery being connected to the first terminal of said radio receiver, and switching means operable to connect either the second terminal of said plurality of interconnected solar cells or the second terminal of said battery to the second terminal of said radio receiver, said switching means operating to prevent at all times the completion of an electrical circuit between said plurality of interconnected solar cells and said battery.

* * * * *